United States Patent [19]

Berenz

[11] Patent Number: 5,580,419
[45] Date of Patent: Dec. 3, 1996

[54] PROCESS OF MAKING SEMICONDUCTOR DEVICE USING FOCUSED ION BEAM FOR RESISTLESS IN SITU ETCHING, DEPOSITION, AND NUCLEATION

[75] Inventor: John J. Berenz, San Pedro, Calif.

[73] Assignee: TRW Inc., Redondo Beach, Calif.

[21] Appl. No.: 217,539

[22] Filed: Mar. 23, 1994

[51] Int. Cl.$^6$ ............................................. H01L 21/306
[52] U.S. Cl. ........................ 156/628.1; 437/22; 437/24; 437/184; 437/228; 437/936; 437/937
[58] Field of Search ............................ 437/22, 24, 180, 437/184, 245, 935, 936; 156/628; 118/719; 148/DIG. 46; 457/228

[56] References Cited

U.S. PATENT DOCUMENTS

| | | | |
|---|---|---|---|
| 4,782,032 | 11/1988 | Geissberger et al. | 437/245 |
| 4,946,735 | 8/1990 | Lee et al. | 428/220 |
| 4,951,601 | 8/1990 | Maydan et al. | 118/719 |
| 4,962,059 | 10/1990 | Nishioka et al. | 437/245 |
| 4,968,636 | 11/1990 | Sugawara | 437/24 |
| 4,975,126 | 12/1990 | Margail et al. | 437/24 |
| 5,004,927 | 4/1991 | Nakagawa | 250/492.2 |
| 5,106,764 | 4/1992 | Harriott et al. | 437/935 |
| 5,186,718 | 2/1993 | Tepman et al. | 437/925 |
| 5,236,509 | 8/1993 | Sioshansi et al. | 118/719 |
| 5,288,379 | 2/1994 | Namiki et al. | 118/719 |
| 5,342,793 | 8/1994 | Santangelo et al. | 437/245 |

FOREIGN PATENT DOCUMENTS 58-178569  10/1983  Japan .
3102823  4/1991  Japan .

OTHER PUBLICATIONS

*Applied Materials*, "Chemical Vapor Deposition", ©1989, pp. 8–10.
Applied Materials, "Plasma Silicon Nitride/Oxynitride Deposition", ©1988.
*MBI*, "Nanofab–150", ©1988.
J. Melngailis "Focused Ion Beam Technology and Applications", J. Vac. Sci. Technol. B vol. 5, No. 2, Mar./Apr., 1987, pp. 469–494.
S. Wolf, "Silicon Processing for the VLSI Era, vol. I", Lattice Press, 1986, pp. 58 and 183.
Wolf, "Silicon Processing for the VLSI Era", vol. 1, pp. 303–305, 1986.
Ghandi, "VLSI Fabrication Principles, Silicon and Gallium Arsenide", pp. 385–386, 1983.

Primary Examiner—George Fourson
Assistant Examiner—Thomas G. Bilodeau

[57] ABSTRACT

Disclosed is a method for producing ultra dense and ultra fast integrated circuits utilizing an advanced ion beam processing system. An exposure chamber which supports a focused ion beam column and an ancillary chamber, both of which are maintained under ultra high vacuum are utilized to perform resistless in-situ etching, deposition, implantation and oxidation processes. By performing these processes within the exposure chamber and the ancillary chamber which contains various connecting chambers, ultra dense and ultra fast integrated circuits can be produced with reduced manufacturing steps thereby increasing production yield and throughput.

17 Claims, 4 Drawing Sheets

| STEPS | OPERATIONS | DOSE REQUIRED | (PIXEL Sz μ²) | AREA/WAFER cm² | EXPOSURE RATE (sec/cm²) | WAFER EXPOSURE TIME (sec) |
|---|---|---|---|---|---|---|
| 1. ZERO LAYER WF₆ | FIB (Ga, 30keV) DEP CHAMBER | $1\times10^{11}$/cm² IN SERIES | 0.5 | 0.546 | 1.6 | .087 (67.5) |
| 2. CHANNEL & CONTACT SELECTIVE IMPLANT | FIB (115keV) | $n^-$ $4\times10^{12}$/cm² $n^+$ $4\times10^{13}$/cm² | 2.0 2.0 | .429 .361 | .1 .3 | 720 .043 (67.5) .108 (67.5) |
| RTA ANNEAL (800°C, 2SEC.) | RTA CHAMBER | | | | | |
| 3. DEPOSITION OHMIC METAL (AuGe) | FIB (Ga, 30keV) DEP CHAMBER | $1\times10^{11}$/cm² IN PARALLEL (12 MINUTES) | 2.0 | 1.81 | .1 | .181 (67.5) |
| 4. ISOLATION IMPLANT (O₂) | FIB (140keV) | $5\times10^{11}$/cm² IN PARALLEL (8 MINUTES) | 0.5 | .503 | .1 | .050 (67.5) |
| RTA ALLOY (450°C, 5MIN) | RTA CHAMBER | | | | | |
| 5. DEPOSIT TFR METAL (NiCr) | FIB (Ga, 30keV) DEP CHAMBER | $1\times10^{11}$/cm² IN PARALLEL (12 MINUTES) | 2.0 | .237 | .1 | .024 (67.5) |
| 6. DEPOSIT METAL GATE (W,Au) | FIB (Ga, 30keV) DEP CHAMBER | $1\times10^{11}$/cm² IN PARALLEL (12 MINUTES) | 0.05 | .0651 | 160 | 10.43 (67.5) |
| 7. DEPOSIT FIC METAL (Au) | FIB (Ga, 30keV) DEP CHAMBER | $1\times10^{11}$/cm² IN PARALLEL (12 MINUTES) | 2.0 | 5.98 | .1 | .598 (67.5) |
| 8. DEPOSIT DIELECTRIC (SiN₃) | FIB (Ga, 30keV) DEP CHAMBER | $1\times10^{11}$/cm² IN PARALLEL (12 MINUTES) | 2.0 | 27.80 | .1 | 2.780 (67.5) |
| 9. DEPOSIT TOP METAL(Au) | FIB (Ga, 30keV) DEP CHAMBER | $1\times10^{11}$/cm² IN PARALLEL (12 MINUTES) | 2.0 | 7.77 | .1 | .777 (67.5) |

Fig-8

PROCESS OF MAKING SEMICONDUCTOR DEVICE USING FOCUSED ION BEAM FOR RESISTLESS IN SITU ETCHING, DEPOSITION, AND NUCLEATION

BACKGROUND OF THE INVENTION

1. Field of the Invention

This invention relates generally to an ion beam processing system and, more particularly, to an advanced ion beam process for producing ultra dense and ultra fast integrated circuits.

2. Discussion of the Related Art

The dimensions of integrated circuits are continually decreasing in order to maximize speed and efficiency while the density and complexity of these integrated circuits continue to increase. As this occurs, the cost of producing such integrated circuits dramatically rises while at the same time lowering the production yield of such integrated circuits. This results because many microelectronic manufacturing problems arise from human contact and error existing in process and equipment operations. Moreover, as new processing strategies develop for the manufacture of complex submicron integrated circuits, an increasing number of processing steps will be added to complete each level of these complex submicron integrated circuits. This will in turn require additional capital equipment while reducing the production yield, throughput and flexibility of these manufacturing facilities even more. Consequently, the manufacturers producing such complex submicron integrated circuits will continuously be influenced to reduce the extensive cost for labor and capital equipment while attempting to increase throughput and production yields.

Currently, lithography is the key manufacturing and patterning step in all integrated circuit fabrication processes. The lithography process employs a photoresist which is a photosensitive plastic. This resist is typically spun on a wafer, baked, and exposed in an intricate pattern, usually by ultraviolet light, although X-rays and electronic beams may also be used. After developing and baking the wafer, the wafer surface is left partly covered by the resist which is an inert organic film that "resists" various treatments to which the bare surface of the wafer is subjected. Such treatments may include material removal by a wet chemical etch or gaseous plasma, doping by ion implantation (i.e. broad beam), or addition of material by evaporation (i.e. lift off). This patterned alteration of the wafer surface using lithography is a slow and tedious multi-step process which requires extensive human contact, as well as positioning the wafer at various work stations all situated in a "clean" room. Moreover, this type of process treats the whole wafer in the same way, and thus is not very flexible.

Photolithography is currently the main lithographic tool for processing patterns in resists above 0.35 microns. However, present and future microelectronics are growing smaller and require minimum feature sizes below 0.25 microns. As microelectronics geometries become even more intricate, geometries will further reduce in size and each process step will become more complex, resulting in additional production yield loss. While a number of lithography techniques such as eximer laser, phase shift, projection ion, X-ray lithography (XRL) or electron-beam lithography (EEL), could be used for production on this scale, all of these techniques are now close to their theoretical performance limits. Pushed to these limits, each of these techniques have weaknesses which present difficult problems.

Each of the above mentioned techniques will produce complex submicron integrated circuits. However, these techniques have several drawbacks associated with them, including additional weaknesses as the complex submicron integrated circuits become smaller and more densely populated. These drawbacks include higher operating costs, additional manufacturing steps, large complex tooling and manufacturing facilities, reduced production yields and ultimate limits on the size integrated circuits that can be produced.

What is needed then is a method of fabricating ultra dense and ultra fast integrated circuits based on a low dose, resistless, in-situ focused ion beam processing system. This will in turn reduce the operating costs, manufacturing steps and size of the manufacturing facility, while at the same time increasing the production yield and allow the manufacture of more complex submicron integrated circuits. It is, therefore, an object of the present invention to provide such a method.

SUMMARY OF THE INVENTION

In accordance with the teachings of the present invention, an advanced ion beam processing system is disclosed for providing a method of producing ultra dense and ultra fast integrated circuits. This is basically achieved by providing an exposure chamber, which supports a focused ion beam column and an ancillary chamber both of which are maintained under an ultra high vacuum. The method essentially utilizes a low dose focused ion beam from the focused ion beam column for performing resistless, in-situ etching, deposition and implantation processes on a wafer to produce the ultra dense and ultra fast integrated circuits.

In one preferred embodiment, a processing station is provided for housing an exposure chamber and an ancillary chamber. A focused ion beam column is attached to the exposure chamber and is utilized for generating a low dose focused ion beam. The exposure chamber and the ancillary chamber are evacuated to create an ultra high vacuum. A wafer is inserted into this vacuum and a mechanical arm is utilized to transport the wafer between the exposure chamber and the ancillary chamber within the vacuum.

At least one recess etch is produced in the wafer by utilizing the low dose focused ion beam from the focused ion beam column in conjunction with an ion beam assisted chemical etch (IBACE) chamber positioned within the ancillary chamber. At least one nucleation deposition is formed on the wafer by utilizing the low dose focused ion beam from the focused ion beam column in conjunction with a nucleation chamber positioned within the ancillary chamber. Additionally, at least one ion implantation doping region is produced in the wafer by utilizing the low dose focused ion beam from the focused ion beam column in conjunction with a rapid thermal anneal (RTA) chamber positioned within the ancillary chamber. By performing the above mentioned processes, various ultra dense and ultra fast integrated circuits utilizing the advanced ion beam processing system can be manufactured.

Use of the present invention results in producing ultra dense and ultra fast integrated circuits by performing resistless, in-situ etching, deposition and implantation processes on a wafer. As a result, the aforementioned problems associated with the current techniques of producing complex submicron integrated circuits are substantially eliminated.

BRIEF DESCRIPTION OF THE DRAWINGS

Still other advantages of the present invention will become apparent to those skilled in the art after reading the following specification and by reference to the drawings in which:

3

Figure 1:
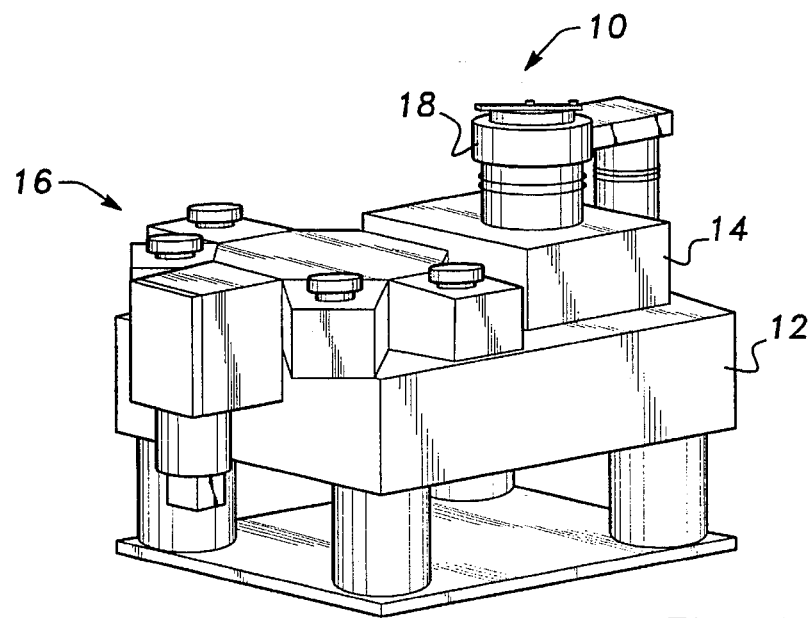
Figure 2:
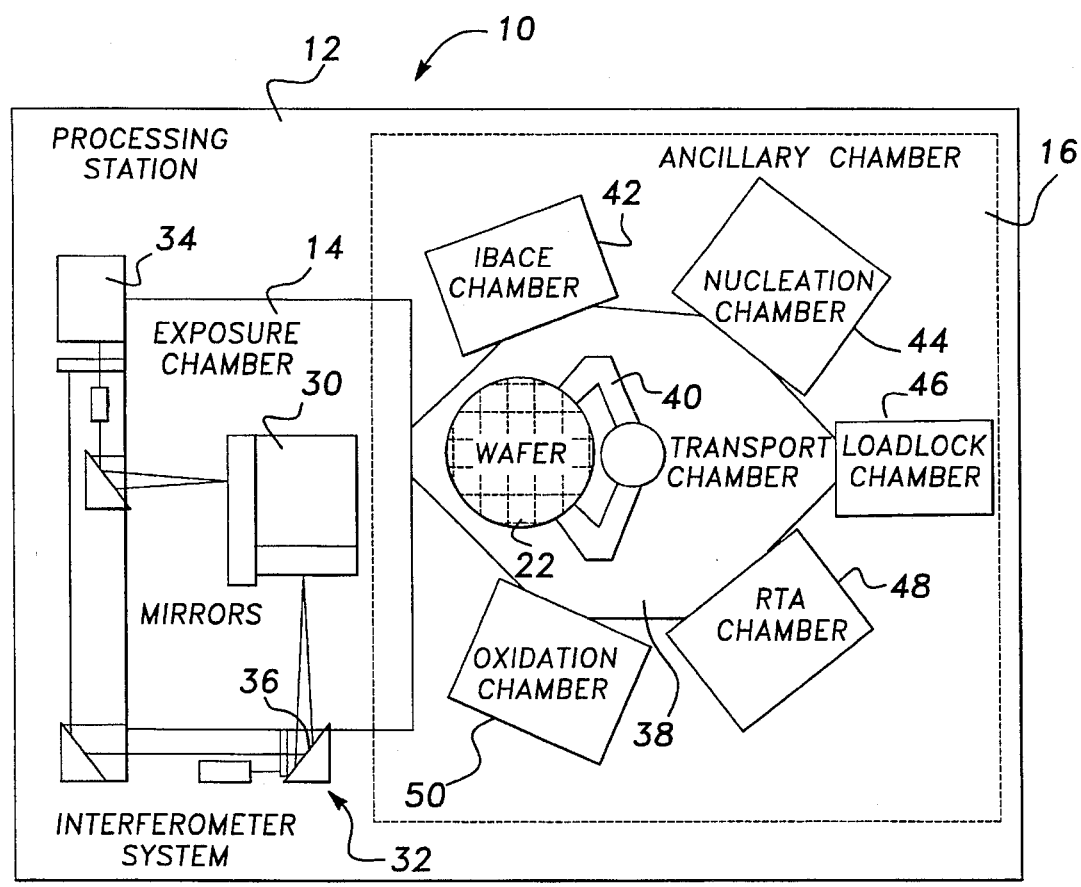
Figure 3:
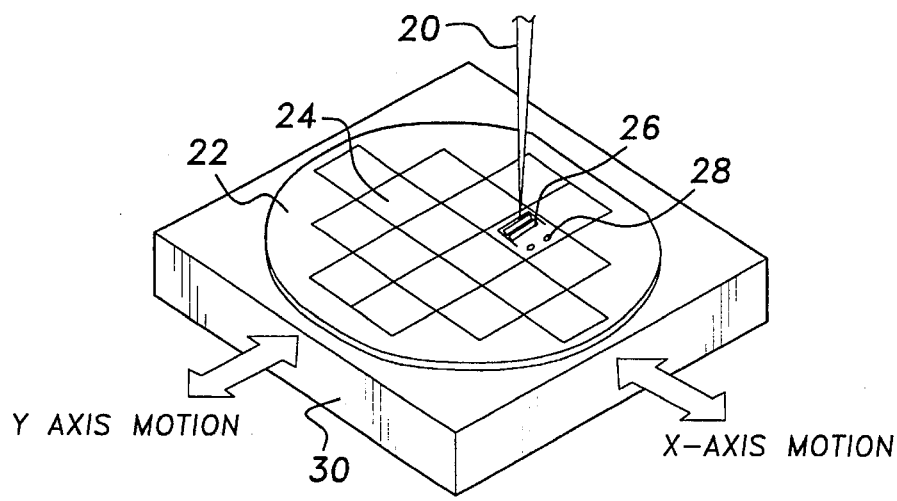
Figure 4:
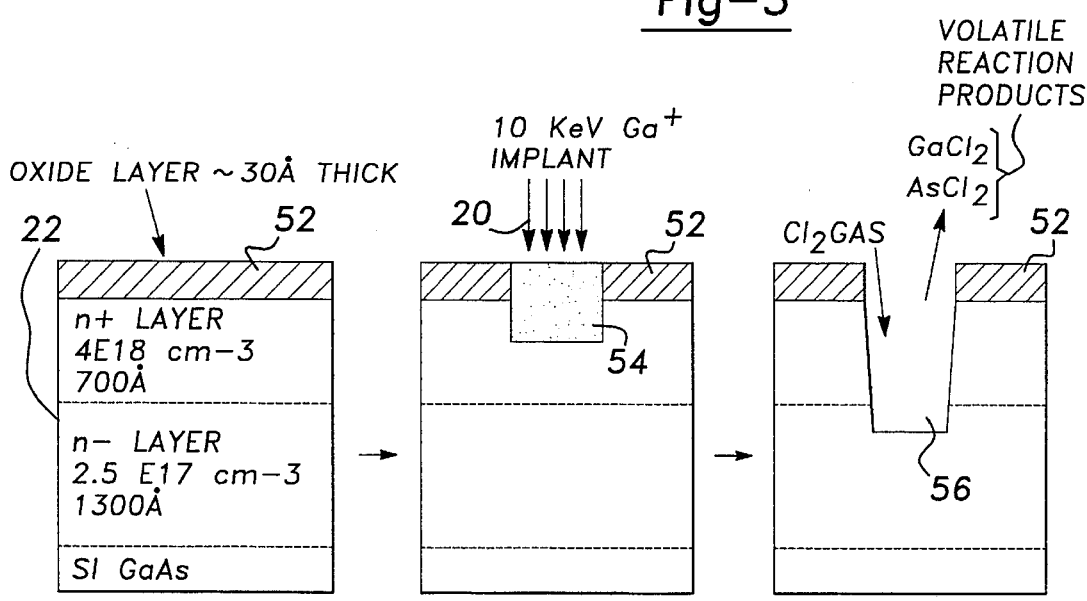
Figure 5:
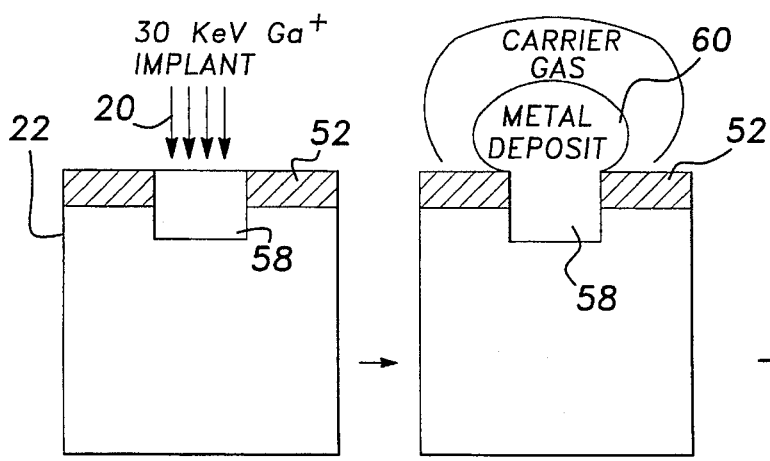
Figure 6:
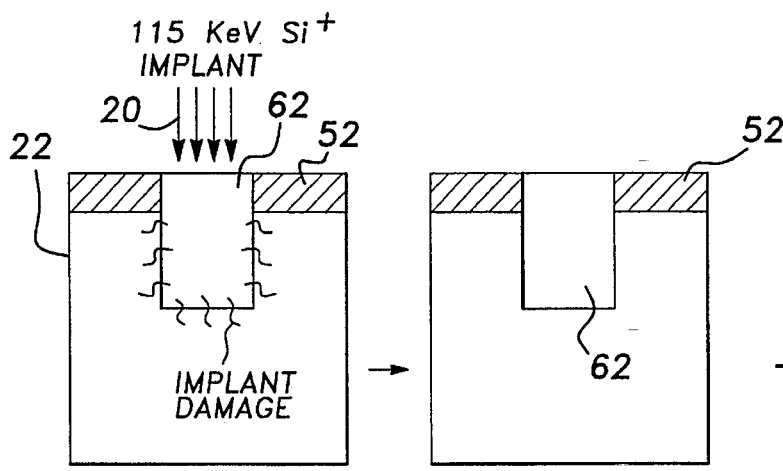
Figure 7:
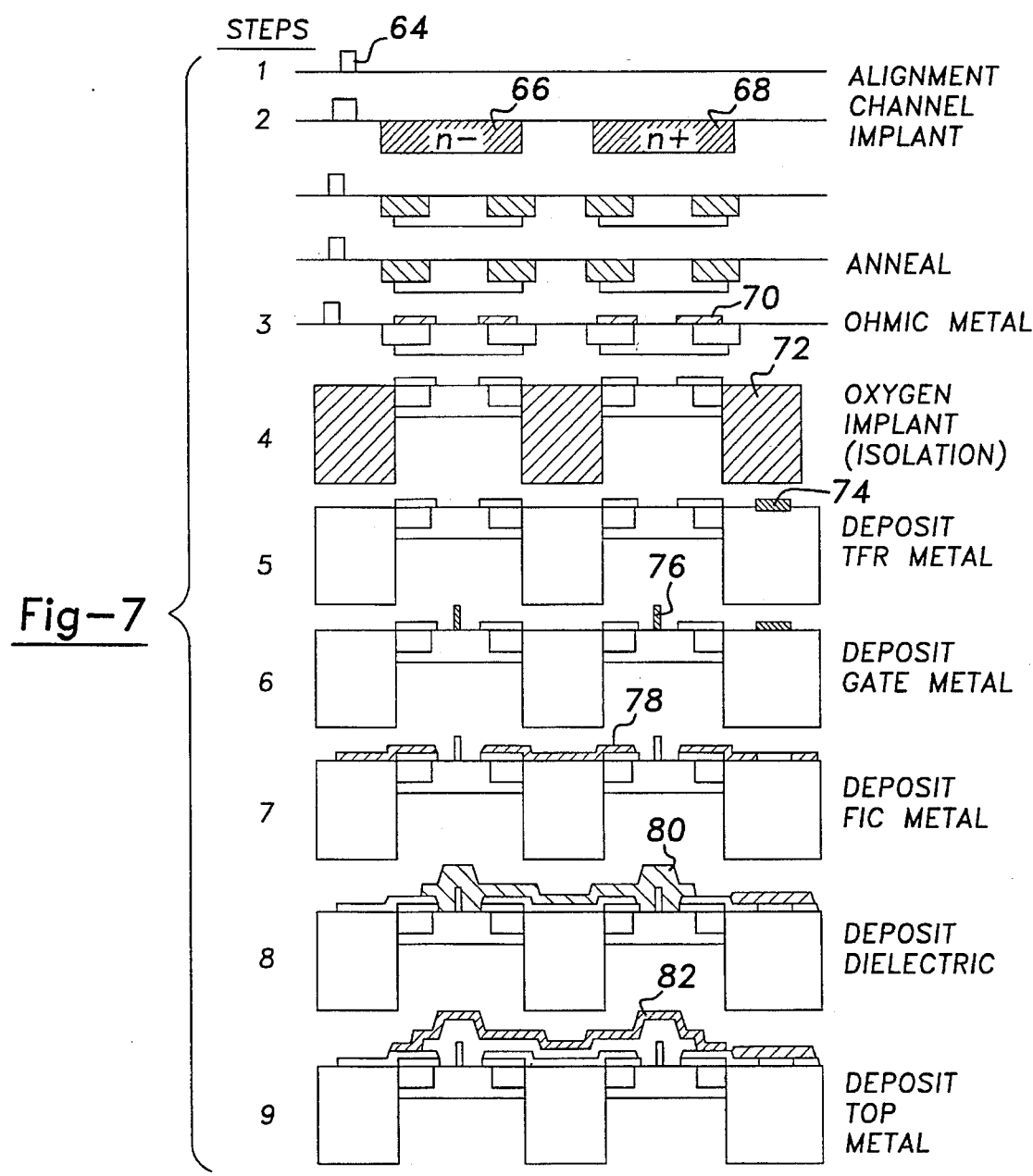

FIG. 1 is a perspective view of one preferred embodiment of the present invention;

FIG. 2 is a cross-sectional top view of the preferred embodiment in FIG. 1;

FIG. 3 is a perspective view of a wafer positioned on a stage housed within the preferred embodiment;

FIG. 4 is a recess etch process utilizing the preferred embodiment;

FIG. 5 is an ion beam nucleation deposition process utilizing the preferred embodiment;

FIG. 6 is an ion beam implantation doping process utilizing the preferred embodiment;

FIG. 7 is an in-situ GaAs MIMIC process utilizing the preferred embodiment; and

FIG. 8 is an in-situ GaAs MIMIC process description.

DETAILED DESCRIPTION OF THE PREFERRED EMBODIMENT

The following description of the preferred embodiment and method concerning an advanced ion beam processing system is merely exemplary in nature and is no way intended to limit the invention or its application of uses. Moreover, the present invention is described in detail below with reference to manufacturing gallium arsenide metal insulated metal integrated circuits (GaAs MIMIC). However, it will be appreciated by those skilled in the art that the present invention, as defined by the appended claims, is clearly not limited to a method of manufacturing only GaAs MIMICs and may be used to manufacture various other types of integrated circuits and microelectronics.

Referring to FIG. 1, a perspective view of an advanced ion beam processing system (AIBPS) 10, is shown. The advanced ion beam processing system 10 includes a processing station 12 which supports and houses an exposure chamber 14 and an ancillary chamber 16, shown more clearly in FIG. 2. The exposure chamber 14 and the ancillary chamber 16 are essentially "clean" rooms that are maintained under ultra high vacuum. A high energy focused ion beam column 18 is supported by and centered atop the exposure chamber 14 which acts as a base plate for the focused ion beam column 18.

The focused ion beam column 18 is preferably a Nanofab 150 produced by FAI of College Park, Md. This focused ion beam column 18 is capable of delivering a focused ion beam (FIB) 20 from many different source elements such as gallium (Ga), gold (Au), and silicon (Si). The focused ion beam 20 can have a current density of up to 200 A/cm$^2$ with a minimum beam spot size as small as 0.01 microns. The focused ion beam 20 is utilized in performing three-dimensional resistless, etching, deposition, and implantation processes on a wafer 22, shown clearly in FIG. 3 and discussed in detail below. The wafer 22 comprises several semiconductor dies 24 which form each integrated circuit 26 having alignment marks 28.

Returning to FIG. 2, a stage 30 is shown within the exposure chamber 14 and is utilized for positioning and moving the wafer 22 beneath the focused ion beam 20. The stage 30 positions the wafer 22 axially along the X-axis and Y-axis by utilizing an interferometer system 32, such as a Phillips EPBG4 ebeam lithography system which acts as a coarse alignment mechanism. The interferometer system 32 uses a combination of a laser 34 and mirrors 36 to properly align and move the stage 30 along the X-axis and the Y-axis while the focused ion beam 20 is writing patterns to the wafer 22. By utilizing the interferometer system 32, the stage 30 can accurately position the wafer 22 within 1.0 micron along the X-axis or the Y-axis. Additional fine three-dimensional alignment and patterning is then performed by the focused ion beam column 18.

The ancillary chamber 16 is preferably an AMS-5000 from Applied Materials of San Jose, Calif., The ancillary chamber 16 includes a central transport chamber 38 used for transporting the wafer 22 under ultra high vacuum to five (5) connecting chambers. A robotic mechanical arm 40 is contained within the transport chamber 38 and is utilized to position and move the wafer 22 between the exposure chamber 14 and the ancillary chamber 16 housing the transport chamber 38 and the five (5) connecting chambers, The five (5) connecting chambers within the ancillary chamber 16 include an ion beam assisted chemical etch (IBACE) chamber 42. The IBACE chamber 42 is utilized to etch the surface of the wafer 22 after it has been three-dimensionally patterned by the focused ion beam 20 in the exposure chamber 14, This etching is essentially performed by heating and exposing the wafer 22 to a volatile gas such as chlorine (Cl$_2$) in the IBACE chamber 42, A nucleation chamber 44 is also connected to the transport chamber 38 and is used for deposition of various elements onto the wafer 22 after it has been three-dimensionally patterned by the focused ion beam 20, The nucleation chamber 44 basically causes elements to grow where the wafer 22 has been exposed to the focused ion beam 20 by heating and exposing the wafer 22 to a carrier gas containing the elements, A loadlock chamber 46 is used for inserting and removing the wafer 22 from the advanced ion beam processing system 10, This loadlock chamber 46 acts as a buffer between the "dirty" outside atmosphere and the "clean" inside environment maintained by the ultra high vacuum inside the exposure chamber 14 and the ancillary chamber 16. The loadlock chamber 46 includes a pump and two valves (not shown) which pumps out the "dirty" outside atmosphere to create an ultra high vacuum within the loadlock chamber 46 before it is opened to the transport chamber 38.

A rapid thermal anneal (RTA) chamber 48 is used for annealing and activation of doping ions in the wafer 22 after the wafer 22 has been three-dimensionally implanted with doped ions from the focused ion beam 20. The RTA chamber 48 activates the doping ions by thermal annealing the wafer 22 with a flashlamp (not shown). An oxidation chamber 50 is used to oxidize the wafer 22 as a whole or selectively wherever the wafer 22 has been three-dimensionally patterned by the focused ion beam 20. The oxidation chamber 50 preferably causes a silicon dioxide (SiO$_2$) layer to form on the wafer 22 by heating and exposing the wafer to a silane (SiH4) and oxygen gas mixture similar to the deposition process performed in the nucleation chamber 44.

In operation, the advanced ion beam processing system 10 can perform resistless, in-situ etching, deposition, implantation and oxidation processes on the wafer 22, as discussed briefly above. Each of these processes are conducted within the advanced ion beam processing system 10 based on the resistless, in-situ processes which do not require the need for human contact with the wafer 22. Additionally, the various processes performed on the wafer 22 within the advanced ion beam processing system 10 are controlled by several parallel off-the-shelf 68030 boards connected in series with direct memory access (DMA), not shown. This hardware utilizes a GDSII Input patterning and control software from Trans Vector Technologies of Culver City, Calif.

Turning to FIG. 4, the recess etch process which is one of the core processes for the manufacture of integrated circuits, is shown in detail for producing a GaAs metal semiconductor field effect transistor (MESFET). The advanced ion beam processing system 10 creates the recess etch by utilizing a two-step batch process involving the focused ion beam column 18 and the IBACE chamber 42. This two-step batch process is conducted after an oxide layer 52 consisting of gallium and arsenic oxide and having a thickness of about 30 angstroms is grown over the entire wafer 22 in the oxidation chamber 50 with ozone plasma. Thereafter, a low dose 10 KeV Ga$^+$focused ion beam 20 is selectively patterned along the oxide layer 52 creating a three-dimension damaged implant region 54. The wafer 22 containing this region 54 is then inserted into the IBACE chamber 42 with the mechanical arm 40 and heated to between about 100° C. to 200° C. Once heated, a volatile gas, preferably chlorine gas ($Cl_2$) is pumped into the IBACE chamber 42 which reacts with the region 54. This causes the release of gallium chloride ($GaCl_2$) and arsenide chloride ($AsCl_2$) bi-products to create a recess etch 56 where the focused ion beam 20 was previously patterned.

Referring to FIG. 5, the ion beam nucleation deposition (IBND) process, is shown in detail for producing the GaAs MESFET. First, the wafer 22 which contains the oxide layer 52 is patterned by a low dose 30 KeV Ga$^+$ focused ion beam 20. This low dose 30KeV Ga$^+$focused ion beam 20 creates a three-dimensional nucleation implant region 58 where the focused ion beam 20 is selectively patterned. Second, the wafer 22 is inserted within the nucleation chamber 44 with the mechanical arm 40 and heated to between about 100° C. to 200° C. Upon heating, a carrier gas such as tungsten hexafluoride ($WF_6$) is flooded into the nucleation chamber 44. As the carrier gas is passed through the nucleation chamber 44, the carrier gas creates a metal deposit 60 of tungsten metal on the wafer 22 which grows epitaxially at the nucleation implant region 58.

Ion implantation doping performed by the advanced ion beam processing system 10 is also a two-step batch process which is shown clearly in FIG. 6. The two-step ion implantation doping process begins by patterning the wafer 22 with a low dose high energy 115 KeV Si$^+$focused ion beam 20. The 115 KeV Si$^+$focused ion beam 20 "shoots" Si$^+$ doped ions into the wafer crystal lattice, thereby damaging the crystal lattice to create a three-dimensional damaged implant region 62. After the wafer 22 has been exposed to the high energy 115 KeV Si$^+$focused ion beam 20, the wafer 22 is then inserted into the RTA chamber 48. The RTA chamber 48 anneals out the damaged crystal lattice and activates the Si$^+$ doping ion implant by utilizing a flashlamp that exposes the damaged implant region 62 with a quartz wavelength radiation.

By combining the above-mentioned two-step batch processes set forth in FIGS. 4–6, numerous integrated circuits and microelectronics can be manufactured utilizing the advanced ion beam processing system 10. For example, turning to FIGS. 7 and 8, a complete process is shown to produce a GaAs MIMIC by utilizing some of the above-described two-step batch processes.

Referring specifically to FIG. 7, it can be seen that there are essentially nine steps to manufacture the GaAs MIMIC by utilizing the advanced ion beam processing system 10. This is in contrast to 11 or 12 steps normally required to produce the GaAs MIMIC. First, in step 1, metal alignment marks 64 are created which are used to maintain and track the wafer 22 alignment in the exposure chamber 14. The metal alignment marks 64 are created by first exposing the wafer 22 to a 30 KeV Ga$^+$ focused ion beam 20 having the dose, pixel size, area, exposure rate and exposure time set forth in FIG. 8. After the wafer 22 is exposed to the 30 KeV Ga$^+$focused ion beam 20, the wafer 22 is then placed in the nucleation chamber 44 where tungsten metal is deposited to create the metal alignment marks 64. In step 2, the wafer 22 is again positioned in the exposure chamber 14 and aligned by using the alignment marks 64. Silicon ions (Si$^+$) are then implanted to create n– and n+ channels 66 and 68 by utilizing a 115 KeV Si$^+$ focused ion beam 20. The wafer 22 is thereafter positioned within the RTA chamber 48 and thermal annealed at the 800° C. for 2 seconds to activate the silicon (Si$^+$) implants.

Turning to step 3, ohmic metal 70 comprising gold-germanium (AuGe) is deposited on the wafer 22 by first utilizing a 30 KeV Ga$^+$focused ion beam 20. Thereafter, the wafer 22 is exposed to gold-germanium (AuGe) gas in the nucleation chamber 44 to epitaxially grow the ohmic metal 70. In step 4, an oxide ($O_2$) isolation implant 72 is created between the channels 66 and 68 by first utilizing a 140 KeV $O_2^+$ focused ion beam 20 Thereafter, the wafer 22 is positioned in the RTA chamber 48 to alloy the gold-germanium contacts by heating the wafer to 450° C. for 5 minutes. Thin filmed resistors (TFR) 74 comprising nickel chrome (NiCr) are deposited on the wafer in step 5 by utilizing a 30 KeV Ga$^+$ focused ion beam 20. The nickel chrome (NiCr) is then grown in the nucleation chamber 44 utilizing nickel chrome (NiCr) gas.

In step 6, gate metal 76 comprising tungsten (W) and gold (Au) is deposited between the ohmic metal contacts 70 which are the source and drain contacts of the FETs. It should be noted that the gate metal 76 is deposited without creating a gate recess in the wafer 22. By doing this, it creates better uniformity throughout the wafer 22 but creates a poor performance FET. This type of FET is typically used in digital applications. If a gate recess is etched before the gate metal 76 is deposited, a high performance FET will be created which results in a high gain device typically employed in analog applications. To create the recess etch, the two-step batch process as set forth previously in FIG. 4 would be employed utilizing the exposure chamber 14 and the IBACE chamber 42. To deposit the gate metal 76, a 30 KeV Ga$^+$ focused ion beam 20 is utilized in conjunction with the nucleation chamber 44.

First interconnect metal (FIC) 78 is then deposited in step 7 to connect or tie components together such as the source and drain of the FET or the source to the thin film resistor 74. This deposition step is performed utilizing the similar two-step batch process as set forth in step 6. After the first interconnect metal 78 is deposited, a dielectric 80 comprising silicon nitrate ($Si_3N_4$) is deposited in step 8, similar to the two-sep batch process in step 7, to fabricate MIM capacitors and provide isolation between the first interconnect metal 78 and a top metal 82. The top metal 82 is deposited over the dielectric 80 also utilizing the similar two-step deposition batch process of step 8, shown clearly in step 9.

The above described process takes approximately 42 minutes per wafer 22 and employs the exposure chamber 14, nucleation chamber 44, RTA chamber 48, and the IBACE chamber 42 if a gate recess etch is incorporated into the device. As the wafer 22 is being processed to create the GaAs MIMIC, it should be noted that multiple wafers 22 will be processed at the same time by utilizing each chamber in parallel so that each chamber is operating at the same time, thereby reducing the manufacturing time and ultimately increasing throughput.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of producing integrated circuits utilizing an ion beam processing system, said method comprising the steps of: providing a processing station that includes an exposure chamber and an ancillary chamber;

providing a focused ion beam column adjoining the exposure chamber for generating a focused ion beam;

evacuating the exposure chamber and the ancillary chamber to create a vacuum therein;

inserting at least one wafer into the vacuum of the exposure chamber and the ancillary chamber;

transporting the wafer between the exposure chamber and the ancillary chamber;

producing at least one recess etch in the wafer by directing the focused ion beam from the focused ion beam column onto the wafer and by utilizing a separate ion beam assisted chemical etch (IBACE) chamber within the ancillary chamber;

growing at least one nucleation deposition on the wafer by first directing only the focused ion beam from the focused ion beam column onto the wafer and followed by utilizing a separate nucleation chamber within the ancillary chamber to heat and expose the wafer to a carrier gas; and producing at least one ion implantation doping region in the wafer by directing the focused ion beam from the focused ion beam column onto the wafer and by utilizing a separate rapid thermal anneal (RTA) chamber within the ancillary chamber.

2. The method as defined in claim 1 wherein the step of inserting the wafer into the vacuum of the exposure chamber and the ancillary chamber includes the steps of:

providing a loadlock chamber within the ancillary chamber;

opening the loadlock chamber to outside atmosphere;

inserting the wafer into the loadlock chamber;

closing the loadlock chamber from the outside atmosphere;

evacuating the loadlock chamber to create a loadlock vacuum;

opening the loadlock chamber to the vacuum of the exposure chamber and the ancillary chamber; and transporting the wafer into the vacuum of the ancillary chamber and the exposure chamber by utilizing a mechanical arm.

3. The method as defined in claim 1 further including the step of producing at least one oxide layer on the wafer by utilizing an oxidation chamber within the ancillary chamber.

4. The method as defined in claim 3 wherein the step of producing the oxide layer further includes the steps of:

positioning the wafer within the oxidation chamber by utilizing a mechanical arm;

heating the wafer inside the oxidation chamber; and exposing the wafer to a silane and oxygen gas to form the oxide layer.

5. The method as defined in claim 1 wherein the step of producing at least one recess etch in the wafer further includes the steps of:

positioning the wafer on a movable stage within the exposure chamber by utilizing a mechanical arm;

resistless patterning an oxide layer on the wafer three-dimensionally with a gallium (Ga+) focused ion beam to create a damaged implant region;

transporting the wafer from the movable stage within the exposure chamber to the separate IBACE chamber within the ancillary chamber by utilizing the mechanical arm;

heating the wafer within the IBACE chamber; and exposing the wafer within the IBACE chamber to a volatile gas to create the recess etch in the wafer at the damaged implant region where the gallium (Ga+) focused ion beam was previously selectively three-dimensionally patterned on the oxide layer.

6. The method as defined in claim 1 wherein the step of producing at least one nucleation deposition on the wafer further includes the steps of:

positioning the wafer on a movable stage within the exposure chamber by utilizing a mechanical arm;

resistless patterning the wafer three-dimensionally with a gallium (Ga+) focused ion beam to create a nucleation implant region;

transporting the wafer from the movable stage within the exposure chamber to the separate nucleation chamber within the ancillary chamber by utilizing the mechanical arm;

heating the wafer within the nucleation chamber; and flooding the nucleation chamber with a carrier gas to create a metal deposit on the wafer which grows epitaxially at the nucleation implant region where the gallium (Ga+) focused ion beam was selectively three-dimensionally patterned.

7. The method as defined in claim 1 wherein the step of producing at least one ion implantation doping region further includes the steps of:

positioning the wafer on a movable stage within the exposure chamber by utilizing a mechanical arm;

resistless patterning the wafer three-dimensionally with a silicon (Si+) focused ion beam to implant doped ions into the wafer to create a damaged implant region;

transporting the wafer from the movable stage within the exposure chamber to the separate RTA chamber within the ancillary chamber by utilizing the mechanical arm; and irradiating the damaged implant region to activate the doped ions and anneal the damaged implant region where the silicon (Si+) focused ion beam was selectively three-dimensionally patterned.

8. The method as defined in claim 1 further comprising the step of simultaneously employing the exposure chamber and the ancillary chamber to parallel process a plurality of wafers.

9. A method of producing a gallium arsenide metal insulated metal integrated circuit (GaAs MIMIC) utilizing an ion beam processing system, said method comprising the steps of:

providing a processing station that includes an exposure chamber and an ancillary chamber;

providing a focused ion beam column adjacent the exposure chamber for generating a focused ion beam;

evacuating the exposure chamber and the ancillary chamber to create a vacuum therein;

inserting at least one wafer into the vacuum of the exposure chamber and the ancillary chamber;

transporting the wafer between the exposure chamber and the ancillary chamber utilizing a mechanical arm;

creating at least one alignment mark on the wafer by nucleation deposition utilizing the focused ion beam from the focused ion beam column and a nucleation chamber within the ancillary chamber;

aligning the wafer on a stage in the exposure chamber by utilizing the alignment mark;

creating n− and n+ channels by ion implantation doping utilizing the focused ion beam from the focused ion beam column and a rapid thermal anneal (RTA) chamber within the ancillary chamber;

depositing an ohmic metal layer by nucleation deposition utilizing the focused ion beam from the focused ion beam column and the nucleation chamber within the ancillary chamber;

creating at least one isolation implant region by ion implantation doping utilizing the focused ion beam from the focused ion beam column and the RTA chamber within the ancillary chamber;

depositing at least one thin film resistor (TFR) by nucleation deposition utilizing the focused ion beam from the focused ion beam column and the nucleation chamber within the ancillary chamber;

depositing gate metal by nucleation deposition utilizing the focused ion beam from the focused ion beam column and the nucleation chamber within the ancillary chamber;

depositing a first interconnect metal (FIC) layer by nucleation deposition utilizing the focused ion beam from the focused ion beam column and the nucleation chamber within the ancillary chamber;

depositing a dielectric layer by nucleation deposition utilizing the focused ion beam from the focused ion beam column and the nucleation chamber within the ancillary chamber; and depositing a top metal layer by nucleation deposition utilizing the focused ion beam from the focused ion beam column and the nucleation chamber within the ancillary chamber.

10. The method as defined in claim 9 wherein the step of depositing gate metal includes the step of creating a gate recess etch utilizing the focused ion beam from the focused ion beam column and an ion beam assisted chemical etch (IBACE) chamber within the ancillary chamber.

11. The method as defined in claim 10 wherein the step of producing the gate recess etch further includes the steps of:

positioning the wafer on a movable stage within the exposure chamber by utilizing the mechanical arm;

resistless patterning the wafer three-dimensionally with the focused ion beam to create a damaged implant region;

transporting the wafer from the movable stage within the exposure chamber to the IBACE chamber within the ancillary chamber by utilizing the mechanical arm;

heating the wafer within the IBACE chamber; and exposing the wafer within the IBACE chamber to a volatile gas to create the recess etch in the wafer at the damaged implant region where the focused ion beam was selectively three-dimensionally patterned.

12. The method as defined in claim 9 wherein the step of generating the focused ion beam from the focused ion beam column includes the step of selecting a source element for the focused ion beam from a group consisting of gallium (Ga), gold (Ag), and silicon (Si).

13. The method as defined in claim 9 wherein the step of inserting the wafer into the vacuum of the exposure chamber and the ancillary chamber includes the steps of:

providing a loadlock chamber within the ancillary chamber;

opening the loadlock chamber to outside atmosphere;

inserting the wafer into the loadlock chamber;

closing the loadlock chamber from the outside atmosphere;

evacuating the loadlock chamber to create a loadlock vacuum;

opening the loadlock chamber to the vacuum of the exposure chamber and the ancillary chamber; and transporting the wafer into the vacuum of the ancillary chamber and the exposure chamber by utilizing the mechanical arm.

14. The method as defined in claim 9 wherein the step of creating at least one alignment mark on the wafer by nucleation deposition further includes the steps of:

positioning the wafer on a movable stage within the exposure chamber by utilizing the mechanical arm;

resistless patterning the wafer three-dimensionally with the focused ion beam to create a nucleation implant region;

transporting the wafer from the movable stage within the exposure chamber to the nucleation chamber within the ancillary chamber by utilizing the mechanical arm;

heating the wafer within the nucleation chamber; and flooding the nucleation chamber with a carrier gas to create the alignment mark on the wafer which grows epitaxially at the nucleation implant region where the focused ion beam was selectively three-dimensionally patterned.

15. The method as defined in claim 9 wherein the step of creating n− and n+ channels by ion implantation doping further includes the steps of:

positioning the wafer on a movable stage within the exposure chamber by utilizing the mechanical arm;

resistless patterning the wafer three-dimensionally with the focused ion beam to implant doped ions into the wafer to create at least two damaged implant regions;

transporting the wafer from the movable stage within the exposure chamber to the RTA chamber within the ancillary chamber by utilizing the mechanical arm; and irradiating the damaged implant regions to activate the doped ions and anneal the damaged implant regions to create the n− and n+ channels where the focused ion beam was selectively three-dimensionally patterned.

16. The method as defined in claim 9 further comprising the step of simultaneously employing the exposure chamber and the ancillary chamber to parallel process a plurality of wafers.

17. The method as defined in claim 1 wherein:

the step of producing at least one recess etch further includes the step of directing about a 10 KeV gallium (Ga+) focused ion beam onto the wafer;

the step of producing at least one nucleation deposition further includes the step of directing about a 30 KeV gallium (Ga+) focused ion beam onto the wafer; and the step of producing at least one ion implantation doping region further includes the step of directing about a 115 KeV silicon (Si+) focused ion beam onto the wafer.

* * * * *